United States Patent
Pu et al.

(10) Patent No.: US 6,459,144 B1
(45) Date of Patent: Oct. 1, 2002

(54) FLIP CHIP SEMICONDUCTOR PACKAGE

(75) Inventors: Han-Ping Pu, Taipei (TW);
Shih-Kuang Chiu, Taichung (TW);
Keng-Yuan Liao, Taichung (TW);
Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/973,611

(22) Filed: Oct. 9, 2001

(30) Foreign Application Priority Data

Mar. 2, 2001 (TW) .......................... 90104830

(51) Int. Cl.⁷ .................. H01L 23/495; H01L 23/28
(52) U.S. Cl. .................. 257/667; 257/778; 257/787; 257/783
(58) Field of Search ..................... 257/778, 667, 257/787, 693, 783; 438/123, 124, 127, 108, 118, 112

(56) References Cited

U.S. PATENT DOCUMENTS

| | | | |
|---|---|---|---|
| 5,336,931 A | * 8/1994 | Juskey et al. | 257/787 |
| 5,386,342 A | * 1/1995 | Rostoker | 361/749 |
| 5,436,203 A | * 7/1995 | Lin | 29/801 |
| 5,844,319 A | 12/1998 | Gamota et al. | 257/778 |
| 5,885,854 A | * 3/1999 | Wensel | 438/127 |
| 6,020,221 A | 2/2000 | Lim et al. | 438/125 |
| 6,335,563 B1 | * 1/2002 | Hashimoto | 257/632 |
| 6,347,037 B2 | * 2/2002 | Iijima et al. | 361/704 |
| 6,228,679 B1 | * 5/2002 | Chiu | 438/108 |

FOREIGN PATENT DOCUMENTS

| | | | | |
|---|---|---|---|---|
| JP | 2-58357 | * | 2/1990 | ................. 257/667 |
| JP | 4-48758 | * | 2/1992 | ................. 257/687 |
| JP | 4-242942 | * | 8/1992 | ........... H01L/21/60 |
| JP | 4-302457 | * | 10/1992 | ........... H01L/23/28 |
| JP | 7-20387 | * | 8/1995 | ........... H05K/3/28 |
| JP | 7-254840 | * | 10/1995 | ........... H03H/9/25 |

* cited by examiner

Primary Examiner—Jasmine J B Clark
(74) Attorney, Agent, or Firm—Peter F. Corless; Steven M. Jensen; Edwards & Angell, LLP

(57) ABSTRACT

A flip chip semiconductor package is proposed, in which a dam structure is formed of an adhesive compound such as epoxy resin on a substrate around a chip. The adhesive compound has a larger coefficient of thermal expansion than that of the substrate, and generates a greater thermal contraction force for counteracting thermal stress of the substrate in a cooling process in fabrication, so as to maintain planarity and structural intactness of the substrate and chip. Moreover, the chip can be made in a manner as to expose a non-active surface thereof to the atmosphere for facilitating dissipation of heat generated by the chip, while a heat sink can be additionally disposed on the chip, so as to further improve heat dissipating efficiency of the semiconductor package.

19 Claims, 7 Drawing Sheets

FLIP CHIP SEMICONDUCTOR PACKAGE

FIELD OF THE INVENTION

The present invention relates to flip chip semiconductor packages, and more particularly, to a flip chip semiconductor package in the use of an adhesive larger in contractibility during thermal contraction.

BACKGROUND OF THE INVENTION

A flip-chip semiconductor package employs advanced packaging technology, which differs from a conventional BGA semiconductor package mainly in that, a semiconductor chip is disposed in the flip-chip semiconductor package in an upside down manner. That is, an active side of the semiconductor chip having a plurality of electronic circuits and electronic elements mounted thereon faces toward a substrate, and is electrically connected to the substrate by a plurality of solder bumps. Then, an underfilling process is performed to underfill gaps between the adjacent solder bumps with an insulative adhesive, for allowing the semiconductor chip to be firmly disposed on the substrate. Such a flip-chip semiconductor package is advantageous with no need of space-occupying bonding wires for providing the electrical connection for the semiconductor chip. This therefore effectively reduces overall thickness of the flip-chip semiconductor package as desired for a low profile demand.

Figure 1:
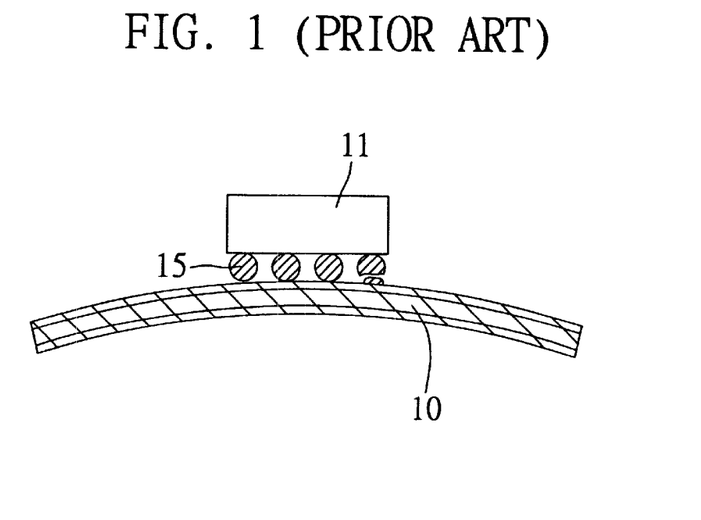
FIG. 1 (PRIOR ART) is a sectional view of a conventional large sized semiconductor package with a warped substrate.

In order to improve both performance and capacity for a single semiconductor package, a substrate can be enlarged in surface area for incorporating more semiconductor chips, or a semiconductor chip can be increased in size for sufficiently accommodating a larger number of electronic elements thereon. However, as shown in FIG. 1, in a solder reflow process for bonding solder bumps 15 and in a cooling process after curing, due to a significant difference in coefficient of thermal expansion (CTE) between a large sized substrate 10 (35×35 mm$^2$) and a large sized semiconductor chip 11 (15×15 mm$^2$), the substrate 10 having a relatively greater CTE thermally contracts more rapidly than the chip 11, and accordingly the substrate 10 is warped with its planarity reduced. This further causes the solder bumps 15 to be delaminated or cracked from the substrate 10, and even impedes the adhesive flow in a subsequent underfilling process, thereby possibly resulting in void formation. As such, the reliability concern for the packaged product is greatly increased.

Figure 2:
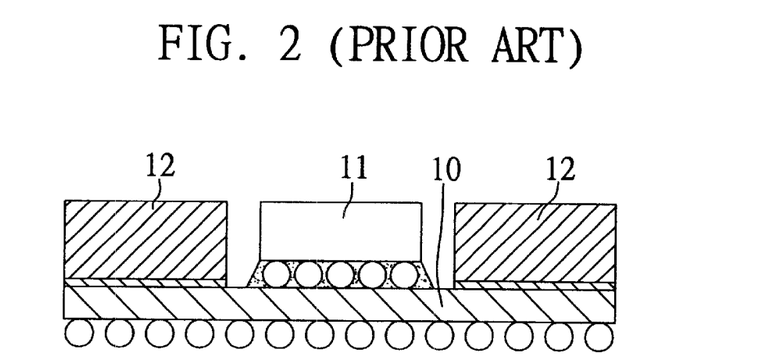
FIG. 2 (PRIOR ART) is a sectional view of a conventional large sized semiconductor package with a stiffener member.

In order to eliminate the above-mentioned drawbacks, U.S. Pat. No. 6,020,221 discloses a fabrication method for preventing substrate warpage from occurrence. As shown in FIG. 2, a stiffener member made of metal such as copper is disposed around the semiconductor chip 11 on the large sized substrate 10, so as to reinforce the resistance of the substrate 10 to thermal contracting stress, and prevent the substrate 10 from deforming in response to the thermal stress in subsequent processes. However, the stiffener member 12 greatly increases the weight of the packaged product, which is not preferable for a low profile demand. Further, the stiffener member 12 is adhered to the substrate 10, and this additional adhering process increases the complexity and cost in fabrication.

Figure 3A:
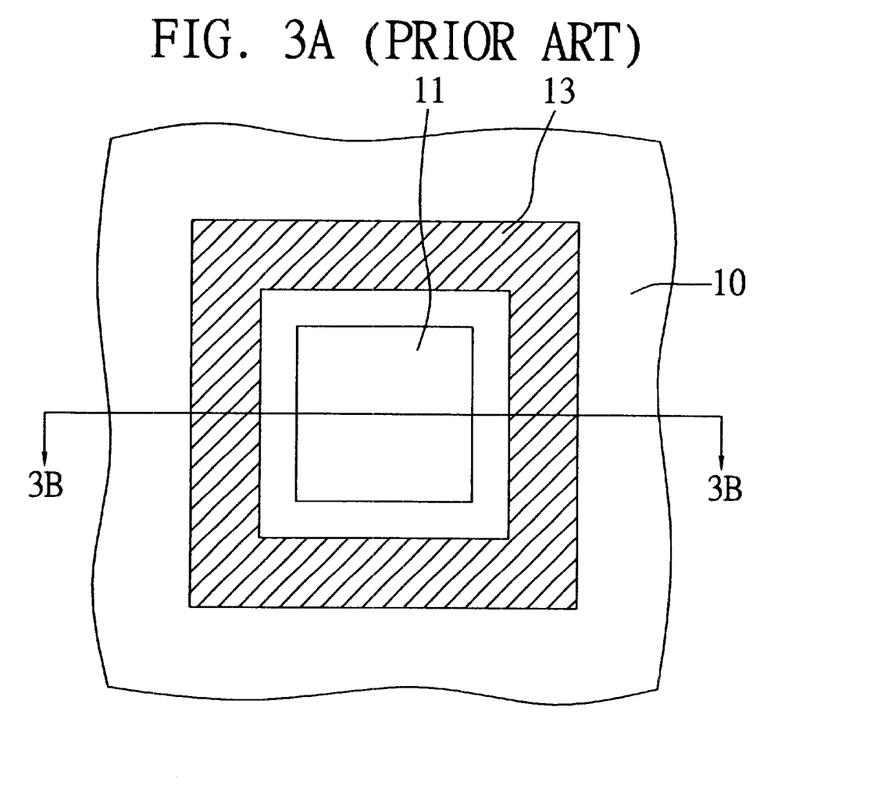
FIGS. 3A and 3B (PRIOR ART) are respectively a top view and a sectional view of a conventional semiconductor package with a collar.
Figure 3B:
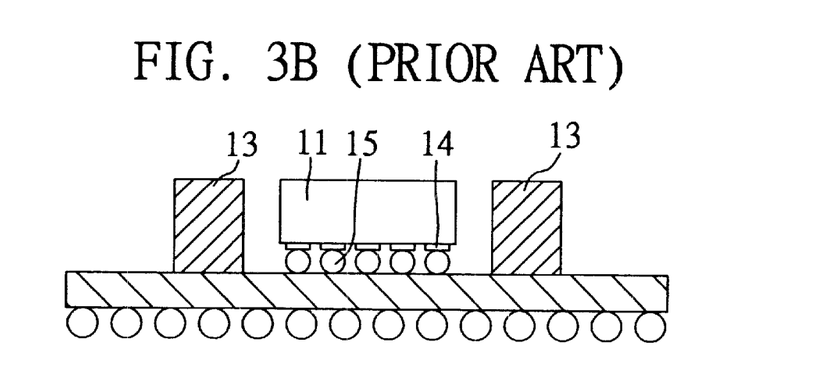

Alternatively, U.S. Pat. No. 5,844,319 discloses the use of a collar 13, which has a smaller CTE than that of the substrate 10 and is disposed around the chip 11 on the substrate 10, as shown in FIGS. 3A and 3B. In the solder-reflow process, the collar 13 is used to absorb the difference in thermal stress between the chip 11 and the substrate 10, so as to maintain the planarity of the substrate 10 and protect solder joints 14 from damage, and further allow maintenance or rework to be easily performed for the chip with no need of the underfilling process. However, in no use of the underfilling process, the gaps between the adjacent solder bumps 15 are not blocked by the insulative adhesive, thereby easily resulting in improper electrical contact and short circuit; further, the chip and the substrate may suffer structural cracking and electricity loss in a high temperature process.

SUMMARY OF THE INVENTION

A primary objective of the present invention is to provide a flip chip semiconductor package, in which an adhesive compound having a larger coefficient of thermal expansion than that of a substrate is used to form an adhesive dam around a semiconductor chip on the substrate, so as to maintain the substrate planarity and structural intactness of the semiconductor chip. Moreover, the use of the adhesive dam, instead of a metal stiffener member, does not increase the overall weight of semiconductor the package, and eliminates the need of an additional adhering process for disposing the stiffener member, so that fabrication cost can be reduced. In addition, in the flip chip semiconductor package, a gap between the semiconductor chip and the substrate is filled with an insulative adhesive, in an effort to prevent improper electrical contact between adjacent solder bumps, and improve bonding quality of the solder bumps, as well as avoid structural cracking for the semiconductor chip and the substrate in a high temperature environment.

In accordance with the foregoing and other objectives, the present invention proposes a flip-chip semiconductor package, comprising a substrate predefined with a chip bonding area for mounting a semiconductor chip thereon; a larger sized semiconductor chip having its active surface facing toward the substrate and electrically connected to the substrate by a plurality of solder bumps; a dam structure formed around the chip and made of an adhesive compound having larger coefficient of thermal expansion of that of the substrate; an insulative adhesive for filling a gap between the chip and the substrate, and for encapsulating the solder bumps; a plurality of solder balls implanted on a back side of the substrate for electrically connecting the substrate to external devices; and an encapsulant for encapsulating the chip.

Since a conventional solder reflow process is employed for bonding the solder bumps to the substrate, it is not further detailed herein. It is to be noted that, during variation from high to low temperature in the solder reflow process, the substrate deforms more rapidly and to a greater extent than the semiconductor chip, and thus the dam structure needs to have more extensive deformation and produce a greater contraction force for counteracting excessive thermal stress of the substrate. As the result, planarity and structural intactness can be well maintained for the substrate and the semiconductor chip, as well as bonding quality of the solder bumps can be assured. Compared to a conventional metal stiffener member for increasing resistance for a substrate to thermal stress, the dam structure of the invention not only reduces overall weight of the semiconductor package, but also eliminates the need of an additional adhering process for use with the metal stiffener member, so that the fabrication cost can be reduced.

Moreover, gaps between the adjacent solder bumps are filled with the insulative adhesive by using a conventional dispensing process; this can prevent the adjacent solder bumps from electrically coming into contact with each other, and also help dissipate thermal stress between the substrate and the semiconductor chip. Therefore, bonding reliability of the solder bumps can be assured, and the substrate and the semiconductor chip can be prevented from structurally cracking at a high temperature in subsequent fabrication processes.

BRIEF DESCRIPTION OF THE DRAWINGS

The present invention can be more fully understood by reading the following detailed description of the preferred embodiments, with reference made to the accompanying drawings, wherein.

DETAILED DESCREPTION OF THE PREFERRED EMBODIMENTS

First Preferred Embodiment

A flip chip semiconductor package of a first embodiment of the invention is described as follows with reference to FIGS. 4 and 5A–5F.

Figure 4:
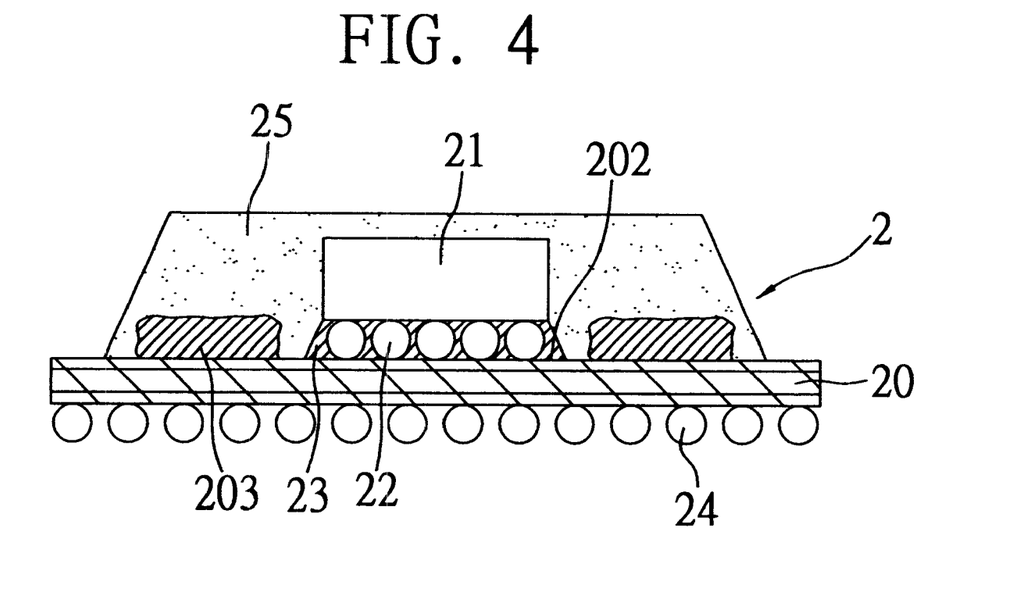
FIG. 4 is a sectional view of a semiconductor package of a first preferred embodiment of the invention.

Illustrated in FIG. 4 is a sectional view of the flip chip semiconductor package of the invention. The semiconductor package 2 of the first embodiment comprises a large sized substrate 20 having a chip bonding area 202 for mounting a large sized semiconductor chip 21 thereon, and electrically connected to the semiconductor chip 21 by a plurality of solder bumps 22; an adhesive dam 203 surrounding the semiconductor chip 21, and made of an adhesive compound having a larger coefficient of thermal expansion (CTE) than that of the substrate 20; an insulative adhesive 23 for filling a gap between the semiconductor chip 21 and the substrate 20, for encapsulating the solder bumps 22; a plurality of solder balls 24 for electrically connecting the substrate 20 to external devices; and an encapsulant 25 for encapsulating the semiconductor chip 21.

Figure 5A:
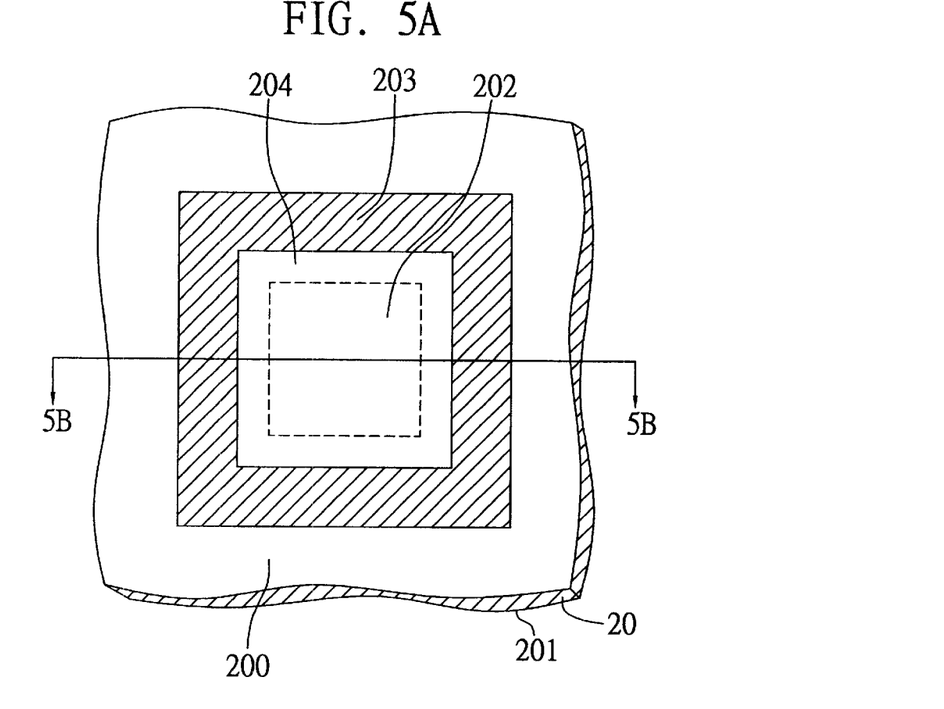
FIGS. 5A–5F are schematic diagrams depicting the steps involved in fabricating a semiconductor package of the invention.
Figure 5B:
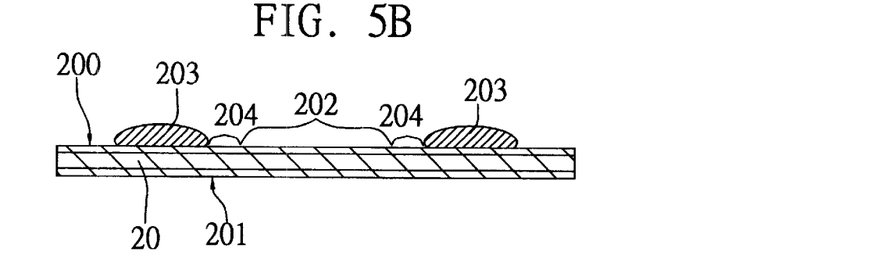

Referring first to FIGS. 5A (top view) and 5B (sectional view), a large sized substrate 20 (referred to a substrate larger in size than 35×35 mm²) has a front side 200 and an opposing back side 201. On the front side 200 there is predefined a chip bonding area 202. An adhesive compound, e.g. epoxy resin with a CTE of 25 ppm/° C., greater in CTE than the substrate 20 is used to form an adhesive dam 203 by using a conventional dispensing process, in a manner that the adhesive dam 203 surrounds and is spaced apart from the chip bonding area 202 by a pathway 204 with a certain width used for adhesive injection in an underfilling process. The type, applying area on the substrate and usage amount of the adhesive compound depend on the surface area and CTE of the substrate. Generally a large sized substrate is made of an organic material such as polyimide resin, bismaleimidetriazine, epoxy resin, or triazine resin. The larger the CTE or size of a substrate, the greater the degree of warpage; thus an adhesive compound having an even higher CTE (i.e. greater contraction degree) is desired.

Figure 5C:
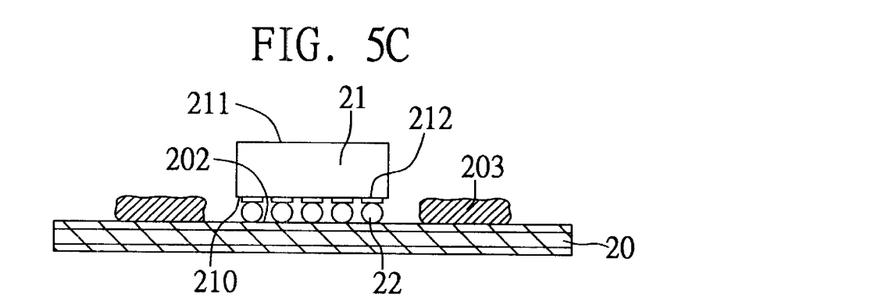

Referring to FIG. 5C, a large sized semiconductor chip 21 (referred to a semiconductor chip larger in size than 15 mm×15 mm) has an active surface 210 and an opposing non-active surface 211. On the active surface 210, there are formed a plurality of bonding pads 212 and a plurality of solder bumps 22, wherein, after disposing the solder bumps 22 on the chip bonding area 202, a solder reflow process is performed for electrically connecting the solder bumps 22 to the substrate 20.

Figure 5D:
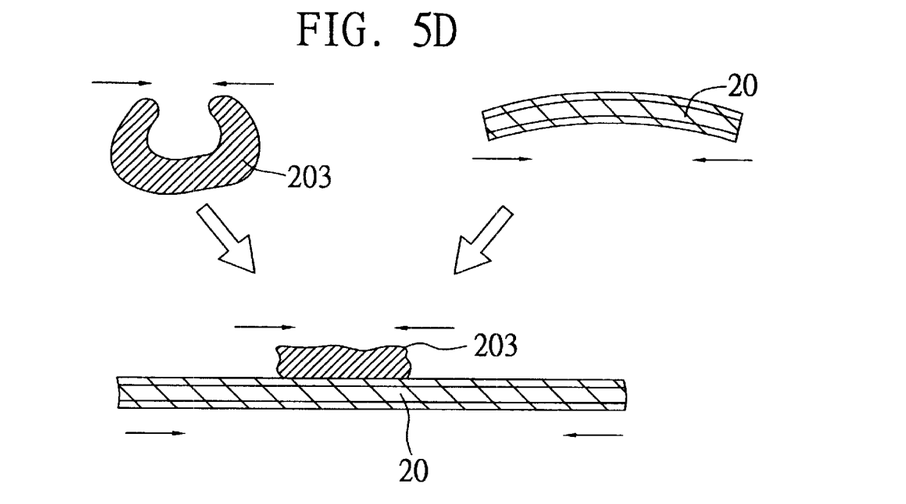

Referring to FIG. 5D, after completing the high temperature solder reflow process, in a cooling process, the adhesive dam 203 surrounding the semiconductor chip 21 thermally contracts more rapidly due to its larger CTE (as indicated by arrows in the drawing). This therefore provides a stronger contraction force to counteract excessive thermal stress of the substrate 20 (as indicated by arrows in the drawing). As a result, planarity of the semiconductor chip 21 and the substrate 20, and bonding reliability of the solder bumps 22 can be assured, as well as quality of performing subsequent fabrication processes (such as underfilling process) for the semiconductor package can be improved.

Figure 5E:
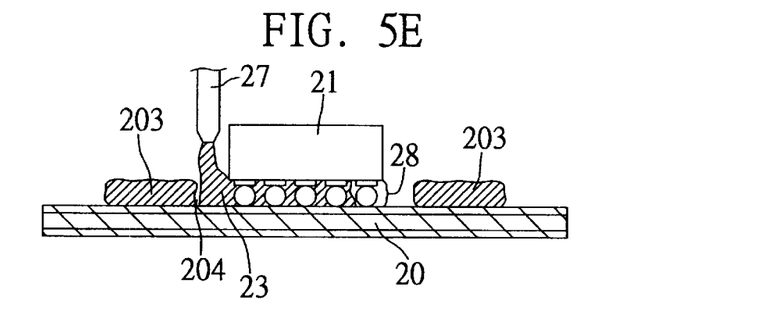

Referring to FIG. 5E, after completing the electrical connection of the solder bumps 22 to the substrate 20, an insulative adhesive 23 is injected by using a conventional dispenser 27 into the pathway 204 between the semiconductor chip 21 and the adhesive dam 203, so as to fill a gap 28 between the semiconductor chip 21 and the substrate 20 and encapsulate the solder bumps 22. This underfilling process is capable of preventing the adjacent solder bumps 22 from electrically coming into contact with each other, and dissipating thermal stress between the substrate 20 and the semiconductor chip 21, so as to maintain structural intactness for both the substrate 20 and the semiconductor chip 21 at a high temperature.

Figure 5F:
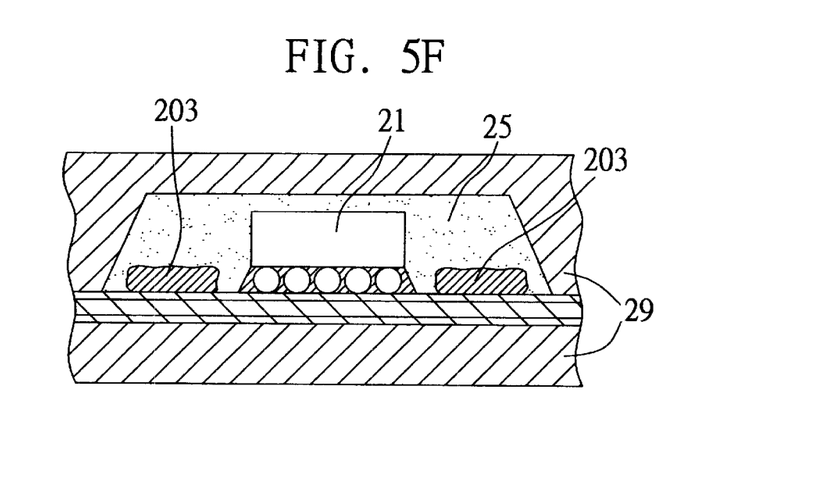

Referring to FIG. 5F, after completing the underfilling process, a molding process is performed in a manner that the semiconductor package 2 is placed in a mold 29, and a molding resin (not shown) is injected into the mold 29 at a high temperature for forming an encapsulant 25 that encapsulates the semiconductor chip 21. Then, a conventional ball implanting process is employed for implanting a plurality of solder balls 24 on the back side 201 of the substrate 20, so as to electrically connect the substrate 20 to external devices. This therefore completes the fabrication of the semiconductor package 2 of the invention, as shown in FIG. 4.

In conclusion, as the adhesive dam 203 can function in counteracting the excessive thermal stress of the substrate 20 in the molding process and the solder reflow process, the planarity of the substrate as well as the quality and reliability of the solder ball implantation can all be effectively assured.

Second Preferred Embodiment

Figure 6:
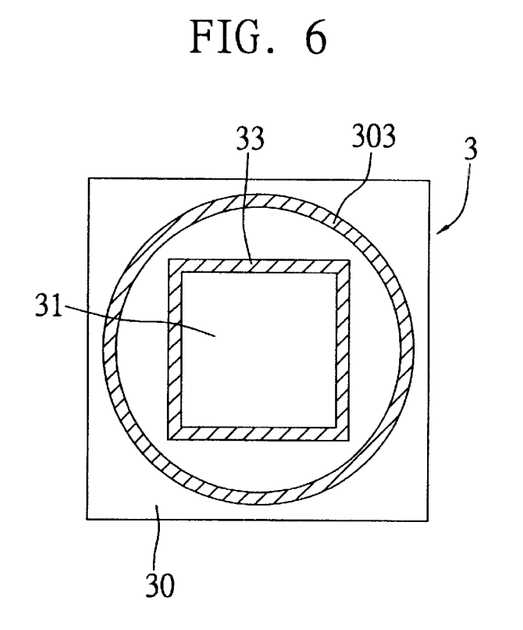
FIG. 6 is a top view of a semiconductor package of a second preferred embodiment of the invention.

FIG. 6 illustrates a top view of a flip chip semiconductor package of a second embodiment of the invention. The semiconductor package 3 of the second embodiment is structurally identical to that of the first embodiment, with the only difference in that, in the semiconductor package 3, a semiconductor chip 31 is used as the center of a circle for forming a circular adhesive dam 303 around the semiconductor chip 31 on peripheral area of a substrate 30, allowing underfilling adhesive 33 together with the semiconductor chip 31 to be included within the adhesive dam 303. Such a circular adhesive dam 303 is symmetrically distributed around the semiconductor chip 31, thereby making the substrate 30 sustain equal contraction force of the adhesive dam 303 at either of two sides thereof, and thus planarity of the substrate 30 can be well maintained.

Third Preferred Embodiment

Figure 7:
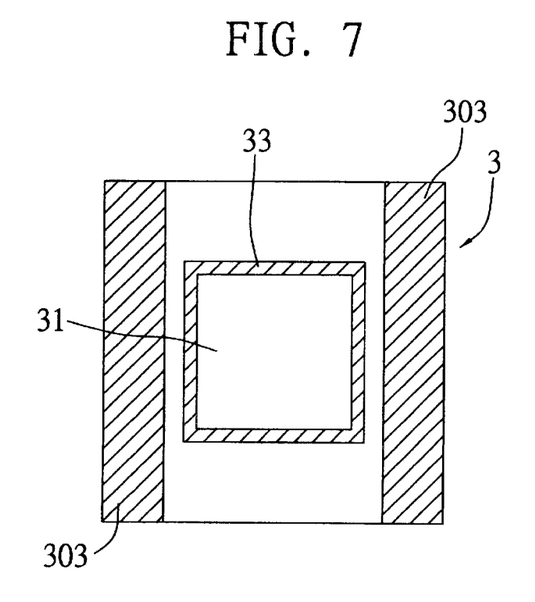
FIG. 7 is a top view of a semiconductor package of a third preferred embodiment of the invention.

FIG. 7 illustrates a top view of a flip chip semiconductor package of a third embodiment of the invention. The third embodiment is structurally and functionally identical to the foregoing first and second embodiments, with the only difference in that an adhesive dam 303 of this embodiment is formed as two strips positioned on peripheral area at two sides of a substrate, respectively. As described above in the second embodiment, since the adhesive dam 303 is symmetrically distributed at two sides of a semiconductor chip, thus planarity of the substrate can be well maintained.

Fourth Preferred Embodiment

Figure 8:
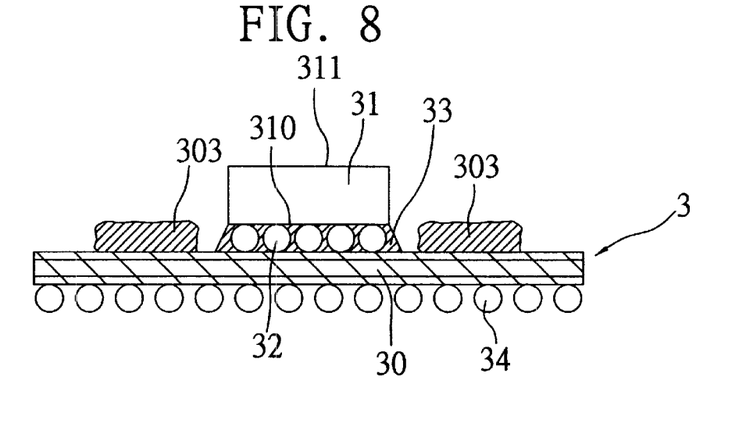
FIG. 8 is a sectional view of a semiconductor package of a fourth preferred embodiment of the invention.

As shown in FIG. 8, a fourth embodiment of the invention is identical to the foregoing first embodiment in structure and fabrication for the semiconductor package, with the only difference in that a semiconductor chip 31 is fabricated in a direct exposing manner in this embodiment. After disposing the semiconductor chip 31 on a substrate 30 in a flip-chip manner, an underfilling process is performed for encapsulating an active surface 310 of the semiconductor chip 31 with no need of a subsequent molding process. This therefore reduces the fabrication cost, and allows a non-active surface 311 of the semiconductor chip 31 to be directly exposed to the atmosphere, so that a heat dissipating path is shortened for facilitating dissipation of heat generated by the semiconductor chip 31.

Fifth Preferred Embodiment

Figure 9:
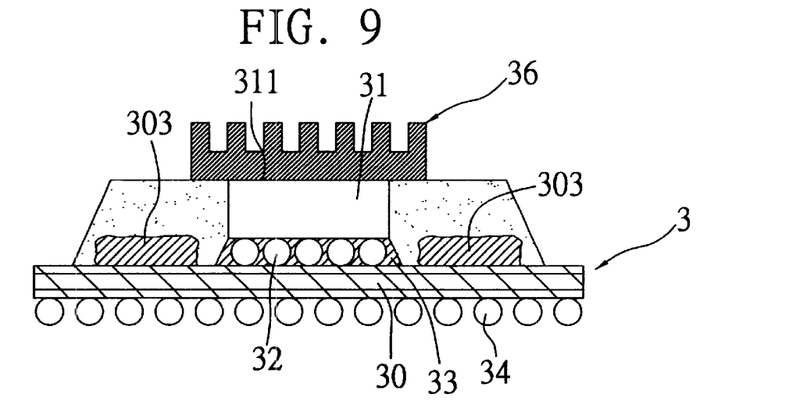
FIG. 9 is a sectional view of a semiconductor package of a fifth preferred embodiment of the invention.
Figure 10:
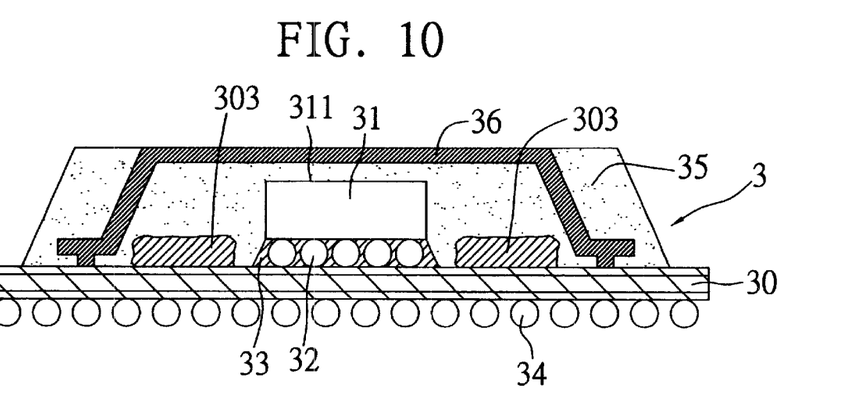
FIG. 10 is a sectional view of another semiconductor package of a fifth preferred embodiment of the invention.

The flip chip semiconductor package of the invention can also incorporate a heat sink for increasing heat dissipating efficiency. As shown in FIGS. 9 and 10, the semiconductor package of the fifth embodiment is structurally identical to that of the first embodiment, with the only difference in that a heat sink 36 of this embodiment is directly or indirectly disposed on a semiconductor chip 31, in consideration of overall thickness of the semiconductor package and the heat dissipating efficiency of the semiconductor chip 31. The heat sink 36 does not interfere with an adhesive dam 303 formed on a substrate 30, and planarity of the substrate 30 disposed with the heat sink 36 can still be well maintained due to thermal contraction of the adhesive dam 303.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip chip semiconductor package, comprising:
   a substrate;
   a semiconductor chip mounted on the substrate in a flip chip manner that a gap is formed between the semiconductor chip and the substrate;
   a dam structure formed on the substrate outside the semiconductor chip, and made of an adhesive compound having a greater coefficient of thermal expansion than that of the substrate;
   an underfilling material for filling the gap between the semiconductor chip and the substrate;
   a plurality of first conductive elements for electrically connecting the semiconductor chip to the substrate; and
   a plurality of second conductive elements for electrically connecting the substrate to an external device.

2. The flip chip semiconductor package of claim 1, wherein the substrate is dimensioned to be larger than 35×35 mm².

3. The flip chip semiconductor package of claim 1, wherein the coefficient of thermal expansion of the substrate is between 16 and 20 ppm/° C.

4. The flip chip semiconductor package of claim 1, wherein the substrate is made of a material selected from the group consisting of polyimide resin, bismaleimide triazine, epoxy resin and triazine resin.

5. The flip chip semiconductor package of claim 1, wherein the semiconductor chip is dimensioned to be larger than 15×15 mm².

6. The flip chip semiconductor package of claim 1, wherein the substrate is much greater in coefficient of thermal expansion than the semiconductor chip.

7. The flip chip semiconductor package of claim 1, wherein the coefficient of thermal expansion of the adhesive compound is 25 ppm/° C.

8. The flip chip semiconductor package of claim 1, wherein the adhesive compound is an insulative material.

9. The flip chip semiconductor package of claim 1, wherein the adhesive compound for forming the dam structure is used in an amount and applied at a position on the substrate dependent on the coefficient of thermal expansion and size of the substrate, respectively.

10. The flip chip semiconductor package of claim 1, wherein the dam structure is formed around the semiconductor chip.

11. The flip chip semiconductor package of claim 1, wherein the dam structure is formed as a circular structure with the semiconductor chip being a circle center.

12. The flip chip semiconductor package of claim 1, wherein the dam structure is formed as two strips on peripheral area at two sides of the substrate.

13. The flip chip semiconductor package of claim 1, wherein the first conductive elements are solder bumps.

14. The flip chip semiconductor package of claim 1, wherein the semiconductor chip has an exposed non-active surface.

15. The flip chip semiconductor package of claim 1, wherein the semiconductor chip is encapsulated by an encapsulant.

16. The flip chip semiconductor package of claim 1, wherein a heat sink is disposed in the semiconductor package.

17. The flip chip semiconductor package of claim 1, wherein the second conductive elements are solder balls.

18. The flip chip semiconductor package of claim 8, wherein the insulative material is epoxy resin.

19. The flip chip semiconductor package of claim 12, wherein gaps between the adjacent solder bumps are filled with the underfilling material.

* * * * *